United States Patent [19]
Mercier

[11] Patent Number: 6,051,895
[45] Date of Patent: Apr. 18, 2000

[54] ELECTRONIC SWITCH RELAY

[75] Inventor: Claude Mercier, Peterborough, Canada

[73] Assignee: Milltronics Ltd., Peterborough, Canada

[21] Appl. No.: 09/061,323

[22] Filed: Apr. 17, 1998

[51] Int. Cl.[7] .................................................. H01H 47/00
[52] U.S. Cl. ........................... 307/125; 327/379; 327/389
[58] Field of Search ..................................... 307/112, 113, 307/116, 125, 126, 130, 131, 134, 139, 140; 327/379, 387, 389, 382, 384, 419; 361/79, 86, 87, 111

[56] References Cited

U.S. PATENT DOCUMENTS

| | | | |
|---|---|---|---|
| 3,995,173 | 11/1976 | Sibley | 307/218 |
| 4,551,634 | 11/1985 | Takahashi et al. | 307/243 |
| 4,755,765 | 7/1988 | Ferland | 330/252 |
| 4,891,807 | 1/1990 | Hutch | 370/112 |
| 5,032,739 | 7/1991 | Koh | 307/243 |
| 5,140,558 | 8/1992 | Harrison, Jr. et al. | 367/7 |
| 5,205,175 | 4/1993 | Garza et al. | 73/628 |
| 5,212,490 | 5/1993 | Nelson et al. | 342/109 |
| 5,262,681 | 11/1993 | Takeda | 307/243 |
| 5,334,881 | 8/1994 | Kirkpatrick | 307/241 |
| 5,437,178 | 8/1995 | Esin et al. | 73/1 |
| 5,502,413 | 3/1996 | Stuhlmiller | 327/361 |

Primary Examiner—Jeffrey Gaffin
Assistant Examiner—Peter Zura
Attorney, Agent, or Firm—Ridout & Maybee

[57] ABSTRACT

An electronic relay for use with an ultrasonic transducer. The electronic relay selectively couples the ultrasonic transducer to an electronic circuit. The transducer includes an input/output port for receiving excitation signals from the circuit and for transmitting echo signals back to the circuit. The electronic relay comprises a solid state switch and a leakage control circuit. The solid state switch is connected between the transducer and the electronic circuit. The switch is responsive to an actuation signal from the circuit for opening and closing the switch. The leakage control circuit is coupled to the switch and functions to control leakage current when the switch is open so as to electrically isolate the transducer from the electronic control circuit.

14 Claims, 5 Drawing Sheets

ELECTRONIC SWITCH RELAY

FIELD OF THE INVENTION

The present invention relates to switching circuits, and more particularly to a relay utilizing electronic switching devices.

BACKGROUND OF THE INVENTION

The common assignee of the subject application is an industry leader in the design and manufacture of ultrasonic measurement devices. Such ultrasonic measurement devices measure the distance between an object and a transducer by sending a high frequency pulse to the object and capturing echoes reflected by the object. By measuring the delay between the transmission of the high frequency pulse and the reception of the echo(s), the distance between the object and the transducer is determined.

In many applications, the ultrasonic device will include several transducers. Multiple ultrasonic transducers allow multiple distances to be measured at the same time. The transducers are coupled to a single electronic control circuit through a series of relays. The relays function as a multiplexer. A transducer is selected, i.e. coupled to the electronic circuit, by activating the associated relay, while the other relays serve to isolate the unselected transducers, thereby preventing cross-talk or interference between transducers. Conventional relays are able to switch high currents and voltages as both lternating current (AC) and direct current (DC). Conventional electromechanical relays also feature a very high galvanic isolation in the order of $10^{12}$ Ohms. The high degree of isolation facilitates multiplexing multiple transducers without giving rise to significant cross-talk between transducers.

To improve the performance of the ultrasonic measurement devices, a temperature sensing circuit 204 is included. Temperature changes in air, gas, water, liquid, etc. will affect the speed of the ultrasonic sound waves, and the temperature sensing circuit allows the effects of temperatures to be taken into account. The temperature sensing circuit measures the temperature inside the transducers, and generates a current proportional to the absolute temperature (1 uA/°K). Because the output from the sensing circuit comprises a current having a typical value between 233 uA for −40° C. and 423 uA for +150° C., it is critical that leakage currents from the other transducers be carefully controlled, otherwise the temperature readings will be inaccurate. For many applications, the ultrasonic measurement device will utilize 10 ultrasonic transducers. Consequently, in order to accurately read a temperature sensing circuit the leakage current contribution from all the transducers must not exceed 0.1 uA, otherwise, the leakage currents may begin to affect the reading from the temperature sensing circuit for the active transducer.

Conventional electromechanical relays utilize mechanical contacts for switching and isolation. While electromechanical relays are capable of providing the required level of isolation between the transducers, the operating life of the relay depends on the mechanical contacts. Repetitive switching of an electromechanical relay causes the contacts to wear. For certain applications of the ultrasonic measurement device, such as grain level monitoring in silos or liquid chemical measurement in a tank, the contacts are more susceptible to degradation due to airborne dust particulate or caustic chemical vapours. In such industrial applications, the chemical vapours will tend to oxidize or ionize the conductive coatings which are applied to the surfaces of the contacts. As the integrity of the contacts deteriorates the current is not able to flow through the relay. As a result, echo and temperature measurements cannot be read. It has been found that in an industrial application with the presence of ammonia vapour, conventional electromechanical relays need to be replaced as soon as 2 months for the ultrasonic measurement device to function properly. Another drawback of electromechanical relays is the switching noise which accompanies the actuation of the contacts.

Accordingly, there remains a need for a suitable replacement for conventional electromechanical relays which provides the isolation characteristics of electromechanical devices while at the same time is resistant to the effects of harsh environments.

BRIEF SUMMARY OF THE INVENTION

The present invention provides an electronic relay which utilizes semiconductor switching devices, such as MOSFET's, thereby eliminating the need for mechanical relay switches and includes an arrangement which minimizes leakage currents in the switching devices thereby achieving a high degree of isolation comparable to existing electromechanical devices.

The present invention is particularly suited for application in ultrasonic measurement devices designed and manufactured by the common assignee of the present application. Such ultrasonic measurement devices measure the distance between an object and a transducer by sending a high frequency pulse to the object and capturing echoes reflected by the object. By measuring the delay between the transmission of the high frequency pulse and the reception of the echo(s), the distance between the object and the transducer is determined. In many applications, the ultrasonic device will include several transducers connected to a single electronic control circuit through a series of relays. The relays function as a multiplexer and a transducer is selected, i.e. coupled to the electronic circuit, by activating the associated relay.

An object of the present invention is to provide an electronic relay which can replace conventional electromechanical relays and improve durability and reliability. The electronic relay according to the present invention exhibits the following features: the capability to switch high and low voltage alternating current (AC), and the capability to switch low voltage (negative) direct current (DC). In the context of an ultrasonic measurement device, the high AC voltage switching capability is needed for the ultrasonic transmit functions. The low AC voltage switching capability is needed for ultrasonic receive functions and the negative DC switching capability is needed for the temperature measurement function.

The electronic relay according to the invention comprises semiconductor (i.e. solid state) switching devices which eliminate the need for mechanical contacts as in conventional electromechanical relays. Advantageously, the elimination of mechanical contacts makes the electronic relay less sensitive to the effects of harsh operating environments, thereby improving the operating life of the device. Another feature of the electronic relay is the elimination of the switching noise from the operation of the mechanical contacts. In addition, the electronic relay according to the invention does not suffer from contact bounce and as a result higher scanning speeds are possible.

In a first aspect, the present invention provides an electronic relay for selectively coupling a transducer to an electronic circuit, the transducer including an input/output port for receiving excitation signals from the electronic control circuit and transmitting echo signals to the electronic control circuit, said electronic relay comprising: (a) a solid state switch having a first port connected to the input/output port of the transducer, a second port coupled to the electronic control circuit, and means for actuating said switch to electrically connect the input/output port of the transducer to the electronic control circuit in an on-state and isolate the input/output port from the electronic control circuit in an off-state, said means for actuating being responsive to a control signal from the electronic control circuit; (b) leakage current control means coupled to said solid state switch for controlling leakage current when said solid state switch is open so that the transducer is electrically isolated from the electronic control circuit.

In another aspect, the present invention provides an electronic relay for selectively coupling a transducer to an electronic circuit, the transducer including an input/output port for receiving excitation signals from the electronic control circuit and transmitting echo signals to the electronic control circuit, said electronic relay comprising: (a) a solid state switch having a first port connected to the input/output port of the transducer, a second port coupled to the electronic control circuit, and means for actuating said switch to electrically connect the input/output port of the transducer to the electronic control circuit in an on-state and isolate the input/output port from the electronic control circuit in an off-state, said means for actuating being responsive to a control signal from the electronic control circuit; (b) said means for actuation comprising a resistor and capacitor network coupled to said switch and having an input port for receiving said control signal.

BRIEF DESCRIPTION OF THE DRAWINGS

Reference will now be made to the accompanying drawings which show, by way of example, preferred embodiments of the present invention, and in which.

DETAILED DESCRIPTION OF THE PREFERRED EMBODIMENTS

Figure 1:
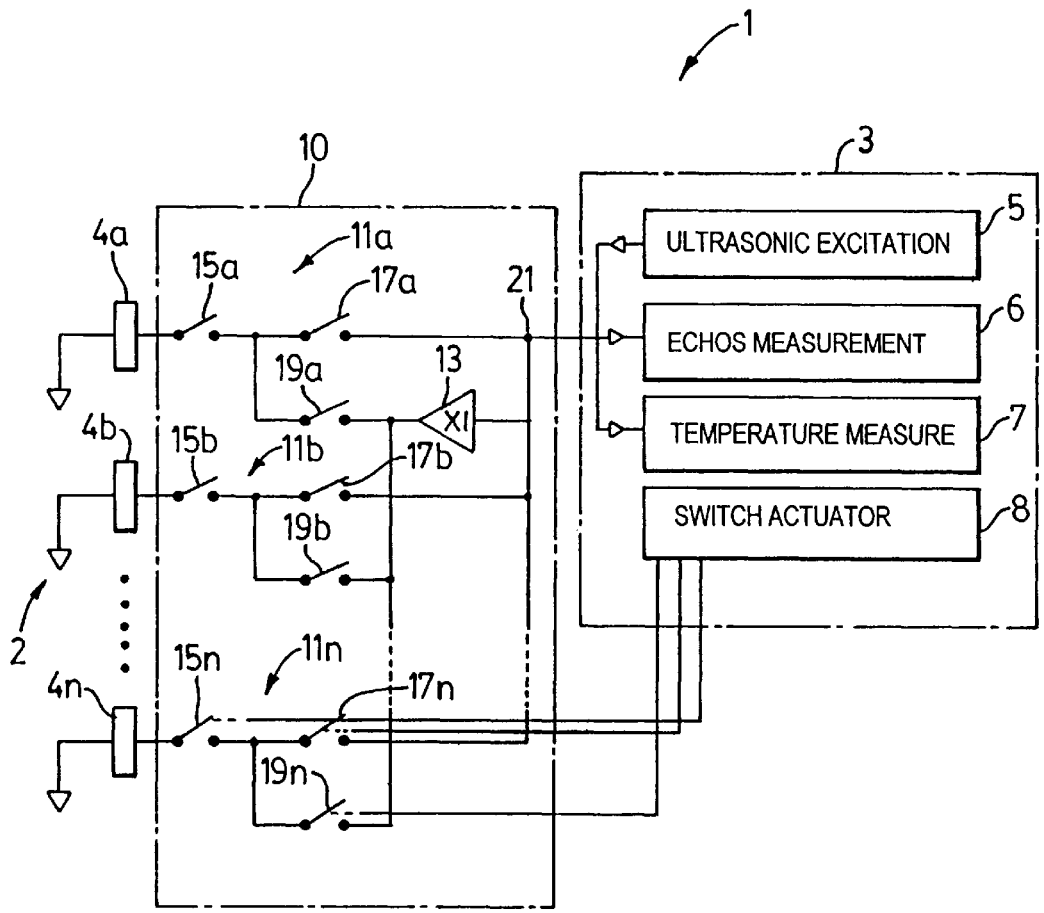
FIG. 1 is a schematic representation of an ultrasonic measurement device with an electronic relay according to the present invention.

Reference is first made to FIG. 1 which shows an ultrasonic measurement device 1 and an electronic relay according to the invention. While the electronic relay will be described in the context of the ultrasonic device 1, it is to be understood that the electronic relay according to the present invention has wider applicability.

As shown in FIG. 1, the ultrasonic measurement device 1 comprises a transducer module 2, a controller module 3, and an electronic relay module 10 according to the present invention. The ultrasonic measurement device 1 is subject of other patents and a brief overview is provided as it pertains to the electronic relay 10, the subject of the present invention. The ultrasonic measurement device 1 provides a means for measuring the distance between an object and the transducer module 2 (i.e. the device 1). Such a device has wide applicability in applications as diverse as grain level measurement in a silo to water level monitoring in flumes. The transducer module 4 comprises a number of transducers 4, shown individually as 4a, 4b . . . 4n in FIG. 1. Each transducer 4 provides three functions as a transmitter for high frequency pulses (i.e. pulses in the ultrasonic frequency range), as a receiver for detecting echoes of the pulses from the object and for temperature measurements. The controller 3 includes an ultrasonic excitation module 5, an echo measurement module 6, and a temperature measurement module 7. The ultrasonic excitation module 5 provides the excitation source for the transducers 4 to produce the high frequency pulses. The high frequency pulses are directed towards the object and the reflections (i.e. echoes) from the object are detected by the transducer module 2 and converted into electrical signals which are processed by the echos measurement module 6 in order to determine the distance between the transducers 4 and the object.

Figure 2:
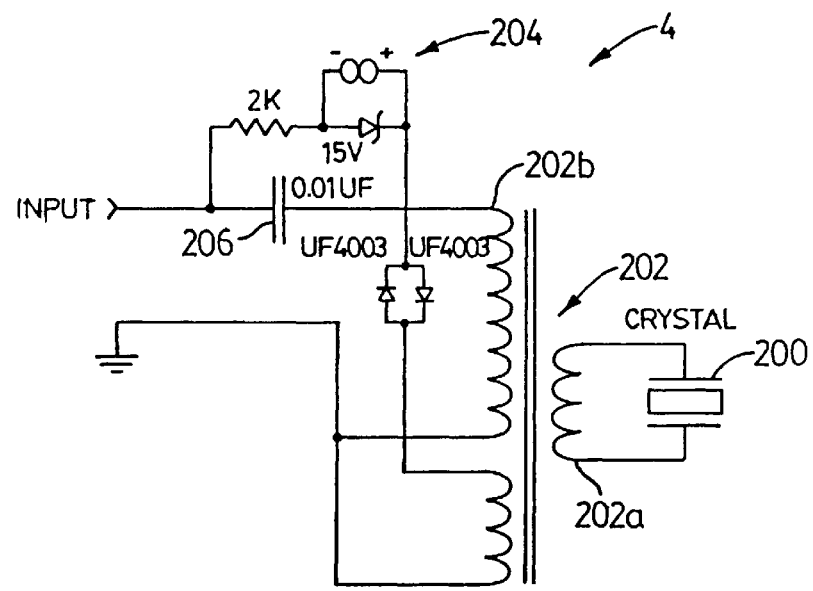
FIG. 2 is a schematic representation of a transducer for the ultrasonic measurement device of FIG. 1.

The transducer 4 is shown in more detail in FIG. 2, and referring to FIG. 2, the transducer 4 comprises a crystal 200 and an excitation coil 202. One side 202a of the excitation coil is coupled to the crystal 200, and the other side 202b of the coil 202 is coupled to the excitation module 5 and the echo measurement module 6 in the controller 3. Because the speed of sound is affected by temperature changes, i.e. in air, gas, water, etc., each of the transducers 4 preferably include a temperature sensor circuit 204. The temperature sensor 204 generates an output signal indicative of the temperature at the transducer 4. The output signal is processed by the temperature measurement module 7 for temperature compensation purposes. The temperature sensor circuit 204 generates a current proportional to the absolute temperature (1 uA/°K). Because this current is typically very small, e.g. the current will vary from 233 uA for −40° C. up to 423 uA for +150° C., the leakage currents through the switching elements in the electronic relay need to be carefully controlled. Furthermore, in many applications for the ultrasonic measurement device 1 up to 10 ultrasonic sonic transducers 4 may be utilized. Consequently, when the temperature sensor 204 in a transducer 4 is read, the leakage currents associated with the switching devices for the other transducers must not exceed 0.1 uA, otherwise the reading from the temperature sensor 204 may be affected. Therefore, the leakage current from the switching devices for each transducer 4 should not exceed 0.01 uA for a device 1 with ten transducers 4. Based on a current polarization of 10 VDC for the temperature sensors 204, an isolation resistance of 1GΩ (i.e. 10 V/0.01 uA) is preferred. In existing devices, electromechanical relay devices were used to provide this degree of isolation. For further details of the ultrasonic measurement device 1 reference should be made to U.S. Pat. Nos. 4,596,144 and 4,992,998 owned by the common assignee of the subject application. In the present invention, the electronic relay module 10 comprises a solid state design.

Referring back to FIG. 1, the electronic relay module 10 comprises a switching module 11 for each of the transducers 4 and a unity gain amplifier 13. In FIG. 1, the switching modules 11 are shown individually as 11a, 11b, . . . 11n. Each switching module 11 comprises a first switch 15, a second switch 17 and a third switch 19. In FIG. 1, the first, second and third switches are shown individually as 15a, 15b, . . . 15n, 17a, 17b, . . . 17n, and 19a, 19b, . . . 19n, respectively. One terminal of each of the first switches 15 is coupled to the respective transducer 4. The other terminal of the first switch 15 is coupled to a terminal of the second switch 17 and a terminal of the third switch 19. The input of the unity gain amplifier 13 is coupled to the other terminal of each of the second switches 17. The input of the amplifier 13 is also coupled to the output of the excitation module 5, the input of the echo measurement module 6 and the input of the temperature measurement module 7. The output of the unity gain amplifier 13 is connected the other terminal of each of the third switches 19. The actuation, i.e. opening and closing, of the switches 15, 17, 19 is controlled by a switch actuator 8 in a manner as will be described below.

It is a feature of the present invention that the switching elements 15, 17, 19 are implemented using semiconductor, i.e. solid state, devices. Semiconductor switching devices have the advantage of eliminating the mechanical contacts. However, semiconductor devices are susceptible to leakage currents which can compromise the isolation of the inactive transducers 4. For example, if the switching elements 15, 17, 19 are implemented using MOSFET (Metal Oxide Field Effect Transistors), there will be a certain current leakage that is proportional to the drain-source voltage when the transistor is in a non-conductive state. An equivalent leakage resistor current is given by the expression $V_{ds}/I_{leakage}$. For a typical MOSFET device, the leakage resistance is often in range 10 MΩ to 40 MΩ. Unfortunately, the leakage resistance tends to decrease at high temperatures thereby causing an increase in the leakage current and a decrease in the isolation between the source and drain.

For an ultrasonic measurement device 1 having two transducers 4, it has been found that while the leakage currents from MOSFET switching devices result in some compromises, performance is not adversely affected. However, the benefits of the solid state switching devices are diminished by the increases in the leakage currents as the number of the transducers 4 is increased. Accordingly, the electronic relay 10 according to the present invention includes an arrangement for eliminating or at least reducing leakage currents to negligible levels.

According to this aspect of the invention, the third switches 19 and the unity gain amplifier 13 are provided to minimize or eliminate the leakage currents through the second switches 17 which is open to isolate the currently inactive transducers 4. As will now be described, the third switches 19 and amplifier 13 generate a null voltage across the open switches 17 in order to minimize the leakage currents. Referring to FIG. 1, if transducer 4a is activated for excitation or echoes measurement, then the first 15a and second 17a switches are closed, while the first 15 and second 17 switches for the remaining transducers 4b to 4n are open for isolation. To eliminate the leakage currents through the open second 17a to 17n switches, the respective third switches 19b to 19n are closed and the third switch 19a is open. The unity gain amplifier 13 amplifies the current without modifying the voltage. This arrangement of open and closed switches causes the voltage at the input to the amplifier 13 and at one terminal of each of the second switches 17b to 17n (i.e. node 21) to be reproduced at the output of the amplifier 13 and at the other terminal of each of the second switches 17b to 17n through the respective closed third switches 19b to 19n. The result is that a null voltage is generated across the respective open switches 17b and 17n and the leakage current is zero. Similarly for the active transducer 4a, a differential voltage of zero is produced across the third switch 19a so that the leakage current of the open switch 19a is also zero.

It will be appreciated that to obtain a perfectly null voltage and leakage current the amplifier 13 would theoretically need to have a perfect unitary gain with no voltage offset. In a practical system, the unity gain amplifier 13 will comprise an operational amplifier, i.e. op-amp, having the highest impedance that is possible and having a voltage offset as low as possible. Operational amplifiers having a 100 uV maximum offset or less are readily available, for example, op-amp model LT1078 manufactured by Linear Technology. Since the MOSFET transistors will have at least 10MΩ minimum at the high temperature, the resulting leakage current will be 10 pA (i.e. 100 uV / 10 MΩ).

Better performance can be achieved by utilizing a chopper stabilized op-amp. Chopper stabilized op-amps typically have an offset voltage under 1 uV. This would result in a leakage current as low as 0.1 pA which is comparable to electromechanical relays. In both cases, i.e. 10 pA or 0.1 pA, the leakage current is small enough that the reading of a transducer is not affected or the error from a temperature sensor is not more than 0.1° C. based on a 1 uA/°C. or 1 uA/°K output from the sensor 204.

In the case where the transducer 4 includes an internal decoupling capacitor 206 (FIG. 2), the unity gain amplifier 13 should still be able to force a null voltage across the open switches if the series of first switches 15a to 15n were removed and replaced by short circuits, for example, leaving second switches 17b to 17n and third switch 19a described above. However, if the transducers 4 exhibit a primarily inductive characteristic, then the amplifier 13 will not be able to force a DC voltage because the inductors will act like a short circuit to ground. Accordingly, the first switches 15 are provided to allow amplifier 13 to force a null voltage across the second switches 17. It will be understood that controlling the leakage currents in the second switches 17 also has the effect of blocking the leakage currents in the first switches 15, and therefore it is not necessary to also generate a null voltage across the first switches 15.

Having described the electronic relay 10, three implementations of the electronic relay 10 will now be described. In the following description, the implementations of the electronic relay are provided for a ultrasonic measurement device utilizing two transducers. It will however be understood that the implementations are suitable for N transducers.

Figure 3:
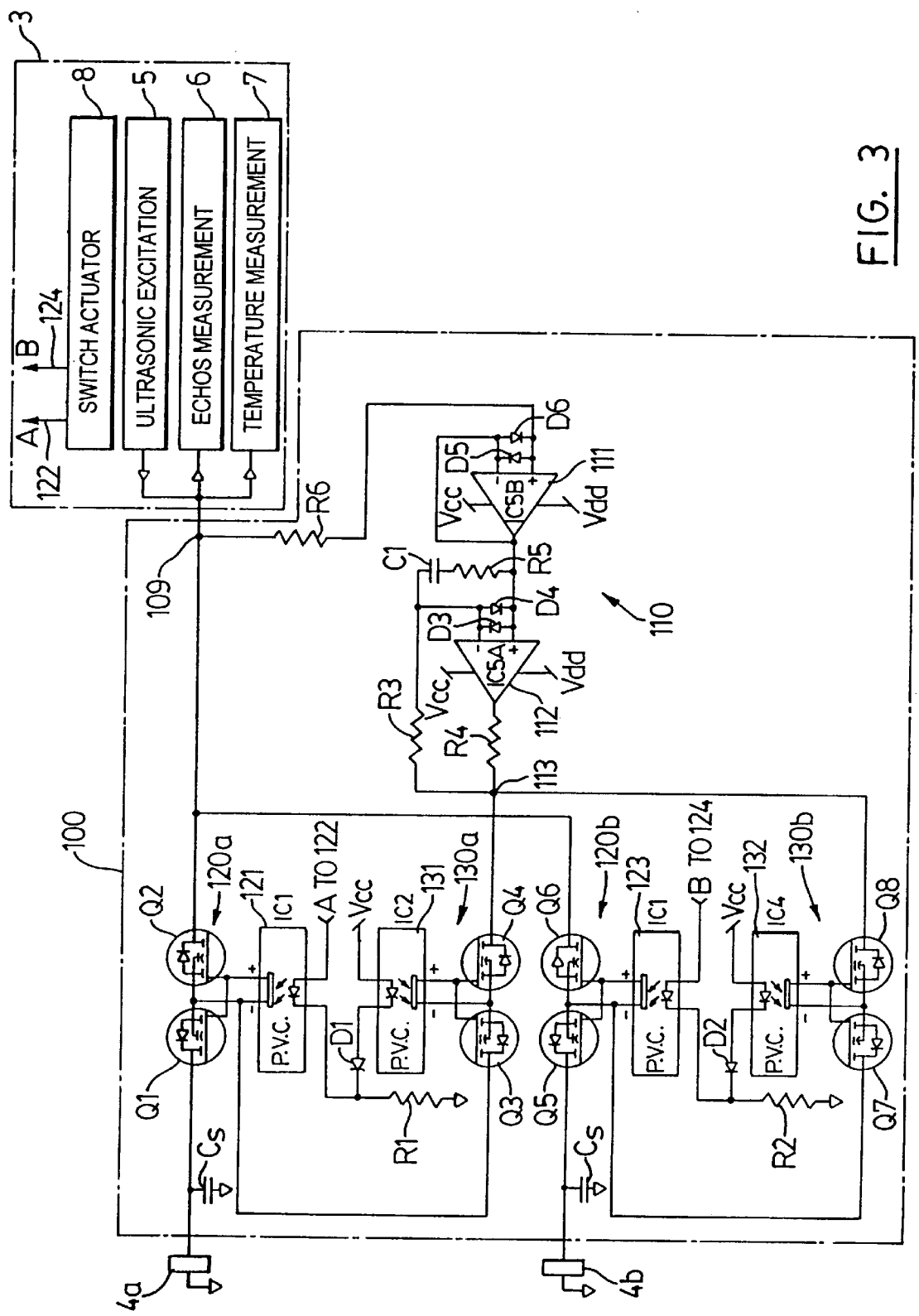
FIG. 3 is a schematic representation of an implementation of the electronic relay of FIG. 1.

Reference is made to FIG. 3, which shows a first implementation of an electronic relay 100. The electronic relay 100 comprises a unity gain amplifier stage 110 and first 120 and second 130 switching elements for each of the transducers 4. The first switching element 120 is used to control the transducer 4, and the second switching element 130 is used to control the leakage currents in the switching elements which are isolating one of the transducers 4. In this implementation, the electronic relay 100 utilizes MOSFET transistors for the switching elements 120, 130. Since a MOSFET can only switch continuous current, two transistors are utilized for each switching element to order to handle alternating current.

The first switching element 120 comprises first Q1 and second Q2 MOSFET (N-channel) transistors, and a photovoltaic coupler 121 or PVC coupler. The coupler 121 is used to generate an isolated voltage which is applied across the source and gate terminals of the transistors Q1 and Q2, and provides the voltage to enable the gates of the MOSFET transistors.

As shown in FIG. 3, the source terminals of the transistors Q1 and Q2 are tied together, and the gate terminals are also tied together. The source terminals of Q1 and Q2 are connected to the negative output terminal of the coupler 121 and the gate terminals of Q1 and Q2 are connected to the positive output terminal of the coupler 121. One of the control terminals of the coupler 121 is connected to a switching control output 122 from the switch actuator 8. The other control terminal of the coupler 121 is connected to signal ground through a resistor R1. The coupler 121 is used to generate a floating voltage high enough to drive the gates and turn on the transistors Q1 and Q2. The coupler 121 should be able to provide an output current of approximately 10 uA. Typical PVC type couplers include a JFET (Junction Field Effect Transistor) on the output which acts to short the gates of the transistors Q1 and Q2 when the coupler 121 is off.

The second switching element 130a comprises first Q3 and second Q4 MOSFET (N-channel) transistors and another PVC coupler 131. As shown in FIG. 3, the source terminals of the transistors Q3 and Q4 are tied together and connected to the negative output terminal of the opto-coupler 131. The gate terminals of transistors Q3 and Q4 are also tied together and connected to the positive output terminal of the of the coupler 131. The control terminal of the coupler 131 is connected to the positive voltage rail $V_{cc}$ and the other control terminal is coupled to the resistor R1 through a diode D1. With this arrangement, the transistors Q3 and Q4 are turned on, i.e. switch 130a is closed, when a signal to turn OFF, i.e. open the switch 120a, is received from the control input 122. Conversely, the transistors Q3 and Q4 are turned OFF when a signal to turn ON the switch 120a is issued on the control input 122.

The first switching element 120b for the second transducer 4b is arranged in a similar fashion to the first switching element 120a. The switching element 120b comprises first Q5 and second Q6 MOSFET transistors and an opto-coupler 123. The source terminals of the transistors Q5 and Q6 are tied together and connected to the negative output terminal of the coupler 123. The gate terminals of transistors Q5 and Q6 are tied together and connected to the positive output terminal of the coupler 123. One control terminal of the coupler 123 is connected to a control output 124 from the switch actuator 8. The other control terminal of the coupler 123 is connected to signal ground through a resistor R2.

The second switching element 130b for the second transducer 4b is arranged in a similar fashion to the switching element 130a and comprises first Q7 and second Q8 MOSFET transistors and an opto-coupler 132. The source terminals of the transistors Q7 and Q8 are tied together and connected to the negative output terminal of the opto-coupler 132. The gate terminals of transistors Q7 and Q8 are also tied together and connected to the positive output terminal of the coupler 132. The control terminal of the opto-coupler 132 is connected to the positive voltage rail $V_{cc}$ and the other control terminal is coupled to the resistor R2 through a diode D2. With this arrangement, the transistors Q7 and Q8 are turned on, i.e. switch 130b is closed, when a signal to turn off, i.e. open the switch 120b, is received from the control input 124.

In this embodiment, the first switching elements 120 are used to enable the respective transducer 4 for excitation and echo measurement. The second switching elements 130, on the other hand, operate together with unity gain amplifier stage 110 to control the leakage currents through the transistors in the switching elements.

As shown in FIG. 3, the amplifier stage 110 comprises a first op-amp 111 and a second op-amp 112. The first op-amp 111 is configured as a unity gain amplifier. The positive and negative inputs of the op-amp 111 are coupled through a resistor R6 to the node formed by the connection of the outputs of the first and second switching elements 120a and 120b. The second op-amp 112 is configured as a voltage follower to supply a low impedance output to the switching elements 130a and 130b. The positive terminal of the op-amp 112 is tied to the output of the first op-amp 111. The negative terminal is coupled to a leakage control node 113 through a feedback resistor R3. The leakage control node 113 is formed from the connection between the drain terminals of transistors Q4 and Q8 in the respective switching elements 130. As shown in FIG. 3, the negative and positive input terminals of the op-amp 112 are coupled through diodes D3 and D4. The output of the op-amp 112 is coupled to the leakage current control node 113 through a resistor R4. The resistor R4 functions as protection device to limit current.

In operation, when transistors Q1 and Q2 are turned OFF, i.e. opened, transistors Q3 and Q4 are turned ON and a voltage is forced on the source of transistor Q2. Because the source of transistor Q1 is at a lower potential then the drain of transistor Q1, the protection diode in transistor Q1 will block the current from ground through the first transducer 4a. Therefore, even if the transducer 4 represents a short circuit to DC (i.e. the transducer 4 does not include a decoupling capacitor), the leakage current through transistor Q1 is controlled. The protection diode in the transistor Q1 effectively replaces the first switch 15 in the arrangement shown in FIG. 1. Since transistor Q1 becomes a high impedance, a voltage can be forced on the source of transistor Q2 to control its leakage current. Through the operation of the unity gain amplifier stage 110 the potential difference between the source and the drain of transistor Q2 becomes zero. Consequently, the leakage current in transistor Q2 will be null.

It will be understood that the offset voltage of the op-amp 111 will affect the precision of the "zero volt" potential between the source and the drain of transistor Q2, which in turn may lead to some leakage current from transistor Q2. Since the leakage current is DC, the leakage current will not affect operation of the transducer 4 and the echos measurement module 6, which operate using AC signals. However, if the resulting leakage current is too high, the operation of the temperature measurement module 7 could be affected since the temperature module 7 responds to DC signals from the sensor 204 (FIG. 1).

Conversely, when transistors Q1 and Q2 are closed, i.e. turned ON to communicate with the associated transducer 4, the transistors Q3 and Q4 are opened or turned OFF. The first op-amp 111 again inputs the voltage signal from the transducer signal node 109 and the signal is reproduced by the second op-amp 112 at the leakage current control node 113. As described above, the output of the second op-amp 112 is a low impedance output. With transistor Q2 turned ON, the resulting potential difference across the turned OFF transistors Q3 and Q4 is zero, i.e. the leakage control node 113 is at the same voltage level as the transducer signal node 109. As a result, the leakage current in the transistors Q3 and Q4 will be zero.

Referring to FIG. 3, diodes D5 and D6 are provided to protect the inputs the first op-amp 111 and the positive input of the second op-amp 112. During the excitation, there is a 400 VAC (peak-to-peak) present at node 109, but this AC voltage is only used to excite the transducer. During the taking of a reading, a low level AC voltage is present at the node 109. The unity gain amplifier 111 follows the voltage at node 109, but the ability of the amplifier 111 to null the voltage for all positive and negative excursions will depend on the characteristics of the transducer (i.e. if the transducer includes a decoupling capacitor). During the temperature reading stage, a negative DC voltage is present at the node 109 and the leakage currents in the MOSFETs are effectively controlled.

The negative input of the second op-amp 112 is protected by the resistor R3 and diodes D3 and D4. The diodes D3 and D4 are coupled to the low impedance output of the first op-amp 111. As a result stray capacitance at the inputs of the op-amp 112, the feedback through resistor R3 will be delayed. Typically, a capacitor would be added in parallel to resistor R3 for compensation. It is however preferable to not include such a capacitor since resistor R3 is provided for protection and a capacitor in parallel would act as a short circuit for high frequency AC signals. (High frequency AC signals are used for the transducers 4.) Instead for compensation, the op-amp 112 includes a snubber circuit comprising a capacitor C1 and resistor R5. As shown in FIG. 3, the snubber circuit is coupled to between the positive and negative inputs of the op-amp 112. The snubber circuit's function is to damp any oscillation between the inputs of the op-amp 112. The capacitor C1 is selected so that it appears as a short circuit at the oscillation frequency.

As also shown in FIG. 3, a capacitor $C_s$ is provided at the output of each transducer 4a, 4b. The function of the capacitors $C_s$ is filter any noise which emanates from a transducer 4 which is not currently selected, i.e. isolated by the associated switching element 120. The stray capacitance between the source and drain of each MOSFET Q1, Q2 (or Q3 and Q4) in the turned-off switching element 120 can transmit noise from the unselected transducer 4 which in turn could corrupt the output being read from the currently selected transducer 4. The capacitor $C_s$ preferably comprises a ceramic type capacitor.

Typical component values for the electronic relay 100 of FIG. 3 are as follows:

| D1 to D6 | 1N4148 |
|---|---|
| Q1 to Q8 | NTP3N50 E |
| R1, R2 | 392 Ohms |
| R3, R6 | 300 KOhms |
| R5 | 4.02 KOhms |
| R4 | 1.88 KOhms |
| C1 | 1 uF |
| PVC's | PVI1050 |
| Op-amp | LT1078 |
| $C_s$ | 220 pF, 500 Volt |

Figure 4:
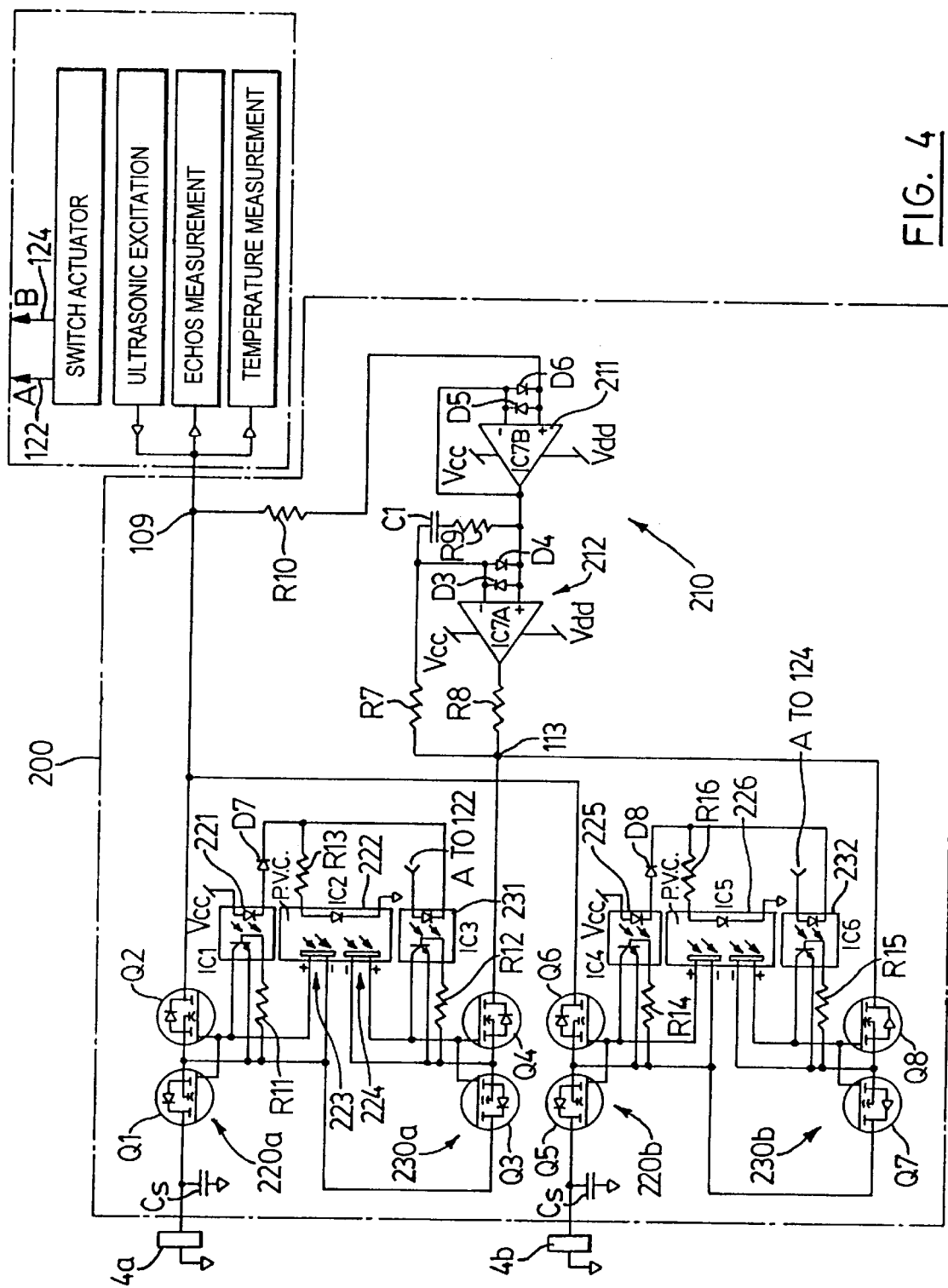
FIG. 4 is a schematic representation of another implementation of the electronic relay of FIG. 1.

Reference is next made to FIG. 4, which shows in schematic form a second embodiment of an electronic relay 200 according to the invention. The electronic relay 200 is very similar to the relay 100 described in FIG. 3, except that the number of PVC couplers has been reduced by two. It will be appreciated that eliminating the number of PVC couplers can result in significant cost savings since the PVC coupler represents the most expensive component in the electronic relay. As will be described, the electronic relay 200 utilizes more cost effective opto-couplers.

In FIG. 4, like reference numerals are used to indicate like elements in the FIG. 3.

Referring to FIG. 4, the electronic relay 200 comprises a unity gain amplifier stage 210, and first 220 and second 230 switching elements for each of the transducers 4. The electronic relay 200 shown in FIG. 4 is configured for two transducers 4a and 4b and the corresponding first switching elements and second switching elements are indicated individually as 220a, 220b and 230a, 230b, respectively. The first switching element 220 is used to control the transducer 4, and the second switching element 230 is used to control the leakage currents in the switching element which is isolating one of the transducers 4. The electronic relay 200 also utilizes MOSFET transistors for the switching elements 220, 230. Since a MOSFET can only switch continuous current, two transistors are utilized for each switching element in order to handle alternating current.

The first switching element 220 comprises first Q1 and second Q2 MOSFET transistors, and an opto-coupler 221. A PVC coupler 222 is shared between the pair of switching elements 220a and 230a. The PVC coupler 222 comprises a known device, such as the PV11050 manufactured by International Rectifier. The PV11050 features dual photo-sensitive output ports (indicated by references 223 and 224 in FIG. 4) which are activated by a single LED source. To turn ON the MOSFET transistors, the PVC coupler 222 needs to provide at least a 10 uA output, which is within the specification of the PV11050 device. The opto-coupler 221 comprises a integrated device such as the H11A1 which is available from a number of manufacturers. The PVC coupler 222 and the opto-coupler 221 are used to generate an isolated voltage which is applied across the source and gate terminals of the transistors Q1 and Q2.

As shown in FIG. 4, the source terminals of the transistors Q1 and Q2 are tied together, and the gate terminals of Q1 and Q2 are also tied together. The source terminals of Q1 and Q2 are connected to the negative output terminal of the first port 223 on the coupler 222 and the gate terminals of Q1 and Q2 are connected to the positive output terminal of the same port 223. The control terminal of the PVC coupler 222 is coupled through a resistor R13 to the control output of an opto-coupler 231 which is connected to the switching control output 122 from the switch actuator 8. One input of the opto-coupler 221 is coupled to the resistor R13 through a protection diode D7 and the other input is tied to the positive supply rail $V_{cc}$. The output port of the opto-coupler 221 is coupled to the tied-together gates and sources of the transistors Q1 and Q2 as shown. The tied-together sources of transistors Q1 and Q2 are also connected to another terminal on the opto-coupler 221 through a resistor R11.

Similarly, the second switching element 230a comprises first Q3 and second Q4 MOSFET transistors and the opto-coupler 231. The source terminals of the transistors Q3 and Q4 are tied together and connected to the negative output terminal of the second port 224 on the PVC coupler 222. The gate terminals of transistors Q3 and Q4 are also tied together and connected to the positive output terminal of the second port 224. As shown in FIG. 4, the gates and sources of the transistors Q3 and Q4 are also coupled to the output port of the opto-coupler 231. The tied-together sources of transistors Q3 and Q4 are also coupled to another terminal of the opto-coupler 231 through a resistor R12.

The arrangement of the PVC coupler 222 and the two opto-couplers 221 and 231 toggles the first 220a and second 230a switching elements ON and OFF in response to the control signal from the switching control output 122 in the switch actuator 8.

The first switching element 220b for the second transducer 4b is arranged in a similar fashion to the first switching element 220a. The switching element 220b comprises first Q5 and second Q6 transistors, and an opto-coupler 225. A PVC coupler 226 is shared between the pair of switching elements 220b and 230b. The transistors Q5 and Q6 are coupled to the opto-coupler 225 and the PVC coupler 226 with resistors R14 and R16 and diode D8 as described above for the first switching element 220a.

The second switching element 230b for the second transducer 4b is also arranged in a similar fashion to the switching element 230a for the first transducer 4a. The switching element 230b comprises first Q7 and second Q8 transistors, and an opto-coupler 232. The transistors Q7 and Q8 are coupled to the opto-coupler 232 and the PVC coupler 226 with resistors R15 and R16 as described above for the switching element 230a.

As shown in FIG. 4, the input control terminal of the opto-coupler 232 is connected to the control output 124 from the switch actuator 8. When the second transducer 4b is selected, the switch elements 220b and 230b are toggled ON and OFF in response to the control signal on the switch control line 124.

The first switching elements 220a, 220b are used to enable the respective transducer 4 for excitation and echo measurement. The second switching elements 230a, 230b, on the other hand, operate together with the unity gain amplifier stage 210 to control the leakage currents through the transistors in the switching elements.

As shown in FIG. 4, the amplifier stage 210 comprises a first op-amp 211 and a second op-amp 212. The first op-amp 211 is configured as a unity gain amplifier. The positive and negative inputs of the op-amp 211 are coupled through a resistor R10 to a node 109 formed by the connection of the outputs of the first and second switching elements 220a and 220b. The second op-amp 212 is configured as a buffer which supplies a low impedance output to the switching elements 230a and 230b. The positive terminal of the op-amp 212 is tied to the output of the first op-amp 211. The negative terminal is coupled to a leakage control node 113 through a feedback resistor R7. The leakage control node 113 is formed from the connection between the drain terminals of transistors Q4 and Q8 in the respective switching elements 230. As shown in FIG. 4, the negative and positive input terminals of the op-amp 212 are coupled through diodes D3 and D4. The output of the op-amp 212 is coupled to the leakage current control node 113 through a resistor R8. The resistor R8 functions as a protection device to limit current.

The electronic relay 200 shown in FIG. 4 operates in the same fashion as the electronic relay 100 described above with reference to FIG. 3. The electronic relay 200 is suitable for the following application range: AC voltages and negative DC voltage levels less than |−15 VDC|.

As shown in FIG. 4, the electronic relay 200 includes capacitors $C_s$ for filtering noise from the respective transducers 4 which could be coupled to the controller 3 through the stray capacitance between the source and drain of the MOSFETs Q1, Q2 or Q5, Q6 as described above for FIG. 3.

Typical component values for the electronic relay 200 of FIG. 4 are as follows:

| | |
|---|---|
| D3 to D8 | 1N4148 |
| Q1 to Q8 | MTP3N50 E |
| R11, R12, R14, R15 | 100 KOhms |
| R13, R16 | 392 Ohms |
| R7, R10 | 300 KOhms |
| R9 | 4.02 KOhms |
| C1 | 1 uF |
| $C_s$ | 220 pF, 500 Volt |
| PVC | PVI1050 |
| Opto-couplers | H11A1 |
| Op-amps | LT1078 |

Figure 5:
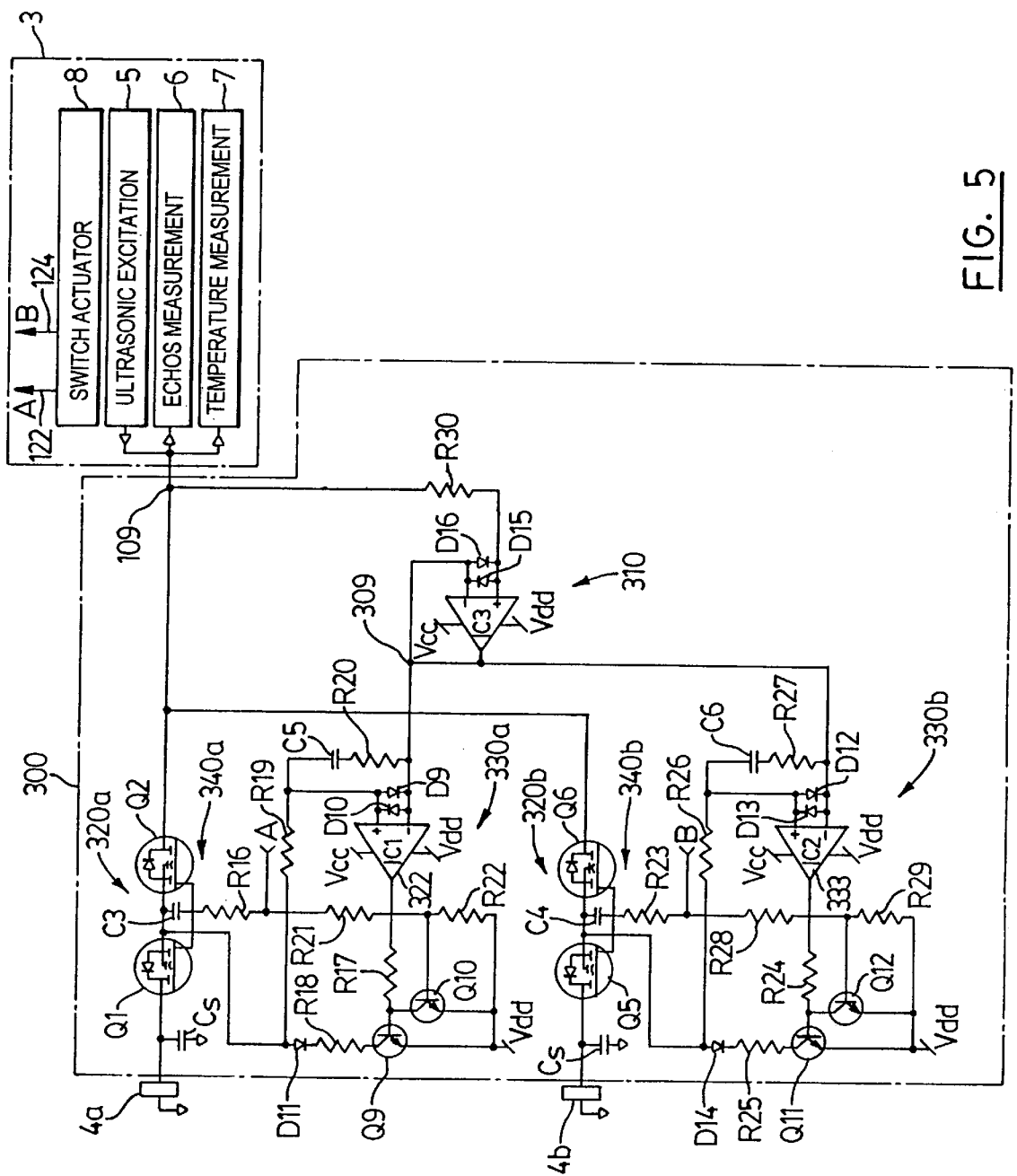
FIG. 5 is a schematic representation of another implementation of the electronic relay of FIG. 1.

For the embodiments of the electronic relay 100 and 200 described above, the PVC couplers were utilized to supply an isolated voltage to enable the gates of the MOSFET transistors. This arrangement enables the MOSFET's to switch ±DC and AC signals. However for the ultrasonic transducers 4 used in the ultrasonic measurement device, the signals encountered for typical operation comprise AC signals at a frequency greater than 1 khertz and DC signals less than 15 Volts and negative. Another embodiment of an electronic relay 300 which is tailored for this operating range is shown in FIG. 5. In the implementation for the electronic relay 300 of FIG. 5, the opto-coupler devices (e.g. 121, 131 in FIG. 3 and 221, 222 and 231 in FIG. 4) and the MOSFET's in the second switching elements (i.e. 130 in FIG. 3 and 230 in FIG. 4) have been replaced by a circuit arrangement which utilizes bi-polar transistors and operational amplifiers. This leads to significant cost savings since the opto-coupler devices and to a lesser extent the MOSFET transistors represent a significant component costs in the electronic relay.

The electronic relay 300 in FIG. 5 is shown for two transducers 4a and 4b, however, it will be understood that circuit may be extended to N ultrasonic transducers. Referring to FIG. 5, the electronic relay 300 comprises a unity gain amplifier stage 310, a switching element 320, a leakage control circuit 330, and a switching drive circuit 340 for each of the transducers 4. The switching element 320 is used to control the transducer 4 and the leakage control circuit 330 is used to control the leakage currents in the switching elements which are isolating a transducer 4 which is not active. The switching drive circuit 340a as will be described below works together with the control circuit 330 to eliminate the need for the PVC couplers by providing an isolated voltage for switching the MOSFET transistors in the switching elements 320.

The switching element 320a for the first transducer 4a comprises first Q1 and second Q2 MOSFET (N-channel) transistors. The drain of the first MOSFET Q1 is coupled to the transducer 4a and the drain of the second MOSFET Q2 is coupled to the node 109. The sources of the transistors Q1 and Q2 are tied together and connected to a terminal of a capacitor C3 in the switching drive circuit 340a. The other terminal of the capacitor C3 is connected a resistor R16 in the switching drive circuit 340a. This terminal of the resistor R16 is also connected to the gates of the transistors Q1 and Q2 which are tied together. The other terminal of the resistor R16 is coupled to the control output 122 of the switch actuator 8 and also to the leakage control circuit 330a.

As shown in FIG. 5, the leakage control circuit 330 comprises an op-amp 332 and first Q9 and second Q10 bi-polar transistors. The negative input of the op-amp 332 is connected to the output of the unity gain amplifier stage 310 at node 309. As shown in FIG. 5, the negative and positive inputs of the op-amp 332 are connected to a pair diodes D9 and D10. The diodes D9 and D10 are provided to protect the inputs of the op-amp 332. The output of the op-amp 332 is coupled to the base of the transistor Q9 through a resistor R17. The emitter of the transistor Q9 is connected to the lower voltage rail $V_{dd}$, and the collector of Q9 is coupled to the positive input of the op-amp 332 through resistors R18 and R19 and a diode D11. The anode of the diode D11 is also connected to the tied together sources of the MOSFET transistors Q1 and Q2.

As shown in FIG. 5, the op-amp 332 also includes a snubber circuit comprising a capacitor C5 and a resistor R20 for compensation. The snubber circuit is coupled between the positive and negative inputs of the op-amp 332, and functions to damp any oscillation between the inputs of the op-amp 332. The capacitor C5 is selected so that it appears as a short circuit at the oscillation frequency.

The collector of the second transistor Q10 is connected to the base of the first transistor Q9, and the emitter of Q10 is connected to the low voltage rail $V_{dd}$. The base of the transistor Q10 is coupled through a resistor R21 to the control output 122. The base of Q10 is also coupled to the lower voltage rail $V_{dd}$ through a resistor R22. The primary function of the transistor Q10 is to enable/disable transistor Q9.

For the second transducer 4b, the second switching element 320b, the leakage current control circuit, and the switching drive circuit 340b are arranged in a similar fashion. The switching element 320b comprises first Q5 and second Q6 MOSFET transistors. The drain of the first MOSFET Q5 is coupled to the transducer 4b and the drain of the second MOSFET Q6 is coupled to the node 109. The sources of the transistors Q5 and Q6 are tied together and connected to a terminal of a capacitor C4 in the switching drive circuit 340b. The other terminal of the capacitor C4 is connected a resistor R23 in the switching drive circuit 340b. This terminal of the resistor R23 is also connected to the gates of the transistors Q5 and Q6 which are tied together. The other terminal of the resistor R23 is coupled to the control output 124 of the switch actuator 8 and also to the leakage control circuit 330b.

As shown in FIG. 5, the leakage control circuit 330b comprises an op-amp 333 and first Q11 and second Q12 bi-polar transistors. The negative input of the op-amp 333 is also connected to the output of the unity gain amplifier stage 310 at node 309. For protection, a pair of diodes D12 and D13 are provided across the negative and positive inputs of the op-amp 333 as shown in FIG. 5. The output of the op-amp 333 is coupled to the base of the transistor Q11 through a resistor R24. The emitter of the transistor Q11 is connected to the lower voltage rail $V_{dd}$ and the collector of Q11 is coupled to the positive input of the op-amp 333 through resistors R25 and R26 and a diode D14. The anode of the diode D14 is also connected to the tied together sources of the MOSFET transistors Q5 and Q6.

The op-amp 333 also includes a snubber circuit for compensation comprising a capacitor C6 and a resistor R27 as shown in FIG. 5. The capacitor C6 is selected so that it appears as a short circuit at the oscillation frequency.

The collector of the second transistor Q12 is connected to the base of the first transistor Q11, and the emitter of Q12 is connected to the low voltage rail $V_{dd}$. The base of the transistor Q12 is coupled through a resistor R29 to the control output 124. The base of Q12 is also coupled to the lower voltage rail $V_{dd}$ through a resistor R29.

For the operation of the electronic relay 300, a command signal of −12 Volts is outputted by the switch actuator 8 on the control lines 122, 124 to turn OFF a switch element 320 (i.e. isolate a transducer 4) and a command signal of +12 Volts is outputted to turn ON a switch element 320 (i.e. select a transducer 4 for excitation and reading, or to input the temperature compensation signal).

Referring to FIG. 5 and, in particular, to the first switching element 320a and the switching drive circuit 340a, when the command signal on the control output 122 is negative, i.e. −12 Volts, the capacitor C3 in the switching control circuit 340a is charged at a negative voltage relative to the sources of the MOSFET transistors Q1, Q2. Even if a high voltage signal is applied by the ultrasonic excitation module 5, the MOSFET transistors Q1 and Q2 will stay off because the capacitor C3 will maintain a more negative voltage on the gates than on the sources of the MOSFET's. Similarly, the MOSFET's Q1 and Q2 in this OFF state will block an AC output signal from the transducer 4a. If the temperature compensation module 8 attempts to read the output signal from the temperature circuit 204 (FIG. 2), then the sources of the MOSFET's Q1 and Q2 are pulled down to −11.4 Volts (i.e. −12 Volts plus the drop across the protection diode for Q2). Consequently, the transistor Q1 does not conduct if a negative continuous voltage is applied on the drain with respect to the source of the transistor Q1.

When a +12 Volt command signal is applied from the control output 122 the protective diode for transistor Q1 forces the voltage at the sources of transistors Q1 and Q2 to approximately 0.6 Volts (i.e. before transistor Q1 conducts). This in turn causes the transistors Q1 and Q2 to conduct. In the conduction state, the voltage drop across transistors Q1 and Q2 is virtually zero and the "On-state impedance" for the switching element 320a will be two times the resistance $R_{on}$ for the transistor Q1 or Q2 (where transistors Q1 and Q2 are matched). For the transistor type utilized for Q1 and Q2 in the switching element 320a, the on-state impedance is less than six Ohms. This low impedance is maintained as long as the sources of the MOSFET transistors Q1, Q2 have a voltage which is less than 0 Volts DC. When the voltage level for a DC signal rises above 8 Volts, the MOSFET's Q1 and Q2 will not conduct. However, this does not present a significant problem because the DC signal of interest for the ultrasonic measurement device is the output signal from the temperature sensor 204 (FIG. 2) and this signal is typically −12 V to 0 V. The differential voltage between the gates and sources of MOSFETs Q1 and Q2 will be between 5 to 17 Volts. For the AC signals outputted to and inputted from the transducer 4a, the capacitor C3 is continuously charged and keeps the transistors Q1 and Q2 ON or in conduction.

Because the temperature reading from the temperature sensor 204 (FIG. 2) is critical to the operation of the ultrasonic measurement device 1, the leakage currents from the transducers 4 which are not selected must be minimized or eliminated. For the electronic relay 300 of FIG. 5, the function of the bi-polar transistor Q9 is to maintain a null potential difference between the source and the drain of the MOSFET Q2 when transistor Q2 is in a non-conduction state. A null voltage across the non-conductive MOSFET Q2 or Q6 means that the leakage current is also null. Accordingly, a transducer 4 which is not selected will not introduce an error in the temperature reading because of leakage current from the MOSFET transistor Q2 or Q6.

In operation, a −12 Volt command signal is applied on the control outputs 122, 124 to disable a transducer 4 and a +12 Volt command signal is applied to enable a transducer 4, i.e. the MOSFET's Q1 and Q2 in the switching element 320 are turned ON. Therefore, to disable the first transducer 4a and select the second transducer 4b, a −12 Volt command signal is applied to the switching drive circuit 340a for the first switching element 320a and a +12 Volt command signal is applied to the switching drive circuit 340b for the second switching element 320b. When the −12 Volt command signal is applied, the transistor Q10 is turned OFF, and the voltage at node 109 is applied to the anode of diode D11 via the unity gain amplifier 310, the amplifier 332 and the transistor Q9. The output from the op-amp 332 controls the transistor Q9 to produce a voltage at the anode of diode D11 equal to the output of the unity gain amplifier 310. The resistor R19 provides feedback of the voltage at the anode of diode D11. When the anode voltage of diode D11 equals the voltage at node 109, the leakage for the MOSFET Q2 will be null. This results in a null leakage current flowing from the MOSFET Q2. Since transistor Q9 is a bipolar transistor it cannot handle AC voltages. It will however be understood that the leakage needs to be controlled the temperature readings are being taken, i.e. a low negative DC voltage level between 0 to −12 V. The diode D11 is provided to disable the transistor Q9 when the voltage level falls below −12 V. The leakage control circuit 330b for the second switching element operates in a similar fashion when the second transducer 4b is disabled.

As shown in FIG. 5, the electronic relay 300 includes capacitors $C_s$ for filtering noise from the respective transducers 4 which could be coupled to the controller 3 through the stray capacitance between the source and drain of the MOSFETs Q1, Q2 or Q5, Q6 as described above for FIG. 3.

Typical component values for the electronic relay 300 of FIG. 5 are as follows:

| | |
|---|---|
| D11, D14 | BYD776 |
| D9, D10, D12, D13 | 1N4148 |
| Q1, Q2, Q5, Q6 | MTP3N50 E |
| Q9, Q11 | MPSA42 |
| Q10, Q12 | 2N4401 |
| R8 | 1.88 KOhms |
| R16, R23 | 10 MOhms |
| R19, R26, R30 | 300 KOhms |
| R18, R25 | 1.88 KOhms |
| R21, R22, R28, R29 | 200 KOhms |
| R17, R24 | 10 KOhms |
| R20, R27 | 4.02 KOhms |
| C5, C6 | 1 uF |
| C3, C4 | 1 nF |
| $C_s$ | 220 pF, 500 Volt |
| Op-amps | LT1078 |

Figure 6:
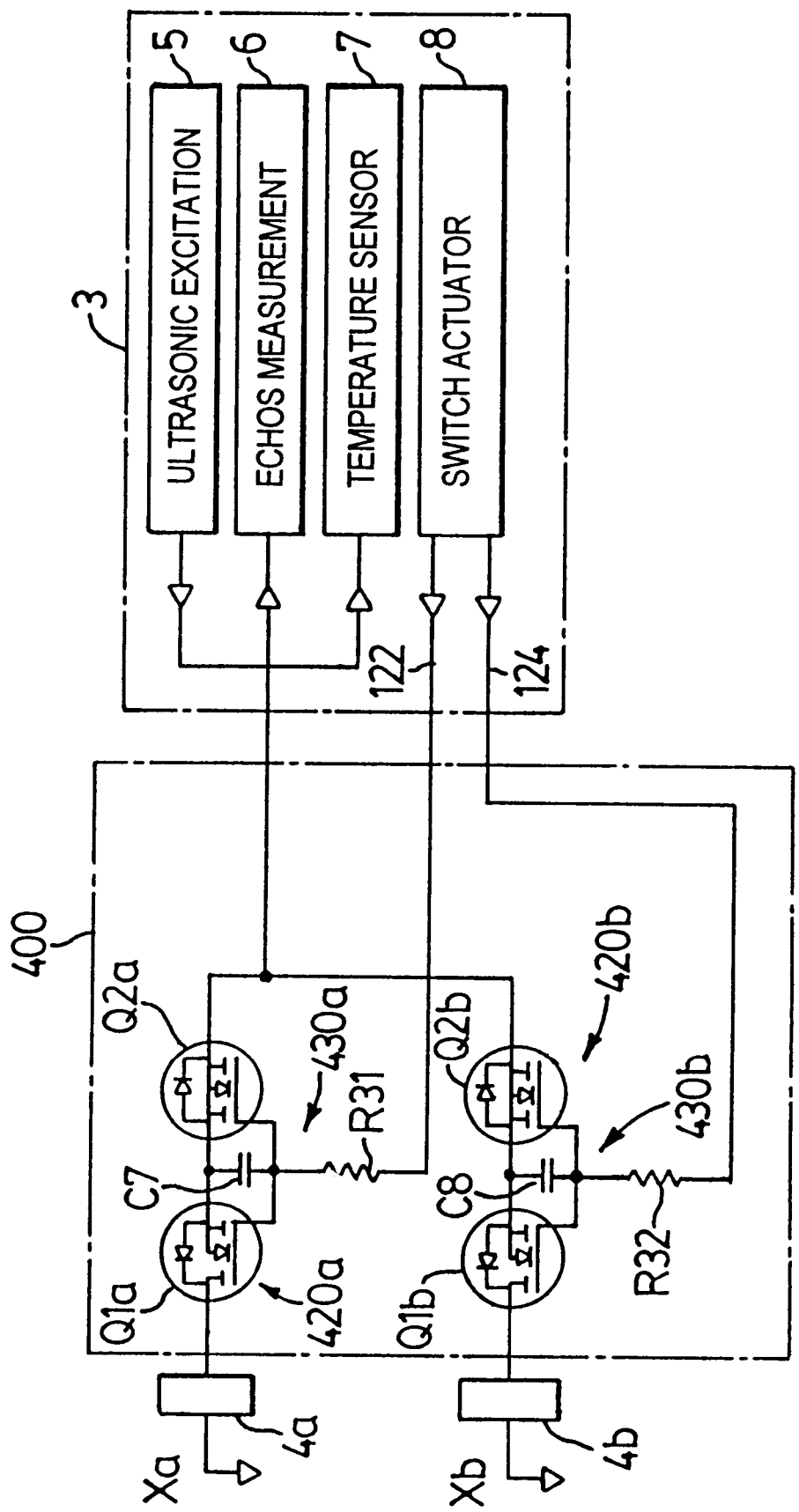
FIG. 6 is a schematic representation of another embodiment of the electronic relay of FIG. 1.

Reference is next made to FIG. 6 which shows another embodiment of an electronic relay 400 according to the invention. The electronic relay 400 is particularly suited for an application comprising two transducers 4a and 4b. For such an arrangement, one of the transducers 4 will be active, and therefore, it is necessary to only eliminate the effect of the other switch in order to input a clean reading from the associated transducer.

Referring to FIG. 6, the electronic relay 400 comprises first 420a and second 420b switching elements. Each of the switching elements 420 includes a respective isolation circuit 430a and 430b. The first switching element 420a comprises first Q1a and second Q2a (N-channel) MOSFET transistors. As shown in FIG. 6, the source terminals of transistors Q1a and Q2a are tied together, and the gate terminals of transistors Q1a and Q2a are also tied together. The drain terminal of transistor Q1a is coupled to the transducer 4a, while the drain terminal of transistor Q2a is coupled to the input/output line of the controller 3. Similarly, the second switching element 420b comprises first Q1b and second Q2b MOSFET transistors. The source terminals of transistors Q1b and Q2b are tied together, and the gate terminals of transistors Q1b and Q2b are also tied together. The drain terminal of transistor Q1b is coupled to the transducer 4b, while the drain terminal of transistor Q2b is coupled to the input/output line of the controller 3.

As shown in FIG. 6, the isolation circuit 430a for the first switching element 420a comprises a capacitor C7 and a resistor R31. The capacitor C7 is coupled across the tied-together source and tied-together gate terminals for the transistors Q1a and Q2a. One terminal of the resistor R31 is connected to the tied-together gate terminals of transistors Q1a and Q2a, and the other terminal of the resistor R31 is connected to the control output 122 from the switch actuator 8. Similarly, the isolation circuit 430b for the second switching element 420b comprises a capacitor C8 and a resistor R32. The capacitor C8 is coupled across the tied-together source and tied-together gate terminals for the transistors Q1b and Q2b. One terminal of the resistor R32 is connected to the tied-together gate terminals of transistors Q1b and Q2b, and the other terminal of the resistor R32 is connected to the control output 124 from the switch actuator 8.

The electronic relay 400 shown in FIG. 6 allows an AC voltage or a low negative voltage (i.e. in the range 0 to −15 VDC) to be switched from the transducer 4. To provide the ability to switch an AC voltage, the drive or control voltage for the MOSFET's Q1 and Q2 needs to be isolated. For the embodiments described above, isolation was provided through the use of opto-couplers and the like. For the electronic relay 400 shown in FIG. 6, isolation is provided by the resistors R31 and R32 in the respective isolation circuits 430a and 430b. The value for the resistors R31 and R32 is high, typically 10 MOhms. While the resistors R31 and R32 do not provide perfect galvanic isolation, i.e. there will be some AC leakage, leakage during the reading of the DC temperature signal is the most critical. During the reading of the DC temperature signal, the capacitors C7, C8 and the gates of the MOSFET's Q1, Q2 prevent leakage currents and possible corruption of the DC signal level being inputted from the selected transducer 4.

During AC operation, i.e. for ultrasonic excitation and echo measurement of a transducer 4, the average voltage across the MOSFET's Q1, Q2 will be zero. To excite and read the first transducer 4a, the switch actuator 8 generates a +5 VDC signal on control output 122 and a −12 VDC signal on control output 124. The +5 VDC on control output 122 turns on the MOSFET's Q1a and Q2a, and the −12 VDC on control output 124 turns off the MOSFET's Q1b and Q2b in the second switching element 420b. If an AC voltage appears at the drain of either MOSFET Q1a or Q2a, the MOSFET Q1a or Q2a will stay on because the capacitor C7 maintains a +5 VDC voltage across the gate and source terminals of the MOSFET's Q1a and Q2a.

To keep the MOSFET's Q1 and Q2 turned ON for the transmission of any AC signal (i.e. excitation signal to transducer 4 or echo measurement signal from the transducer 4), the RC constant for resistor R31 and capacitor C7 (and resistor R32 and capacitor C8) should be at least 10 times greater than the period of the lowest frequency AC signal applied to the transducer 4. To provide an additional measure of protection, the values for the resistors R31, R32 and capacitors C7, C8 are selected to give a RC constant of at least 100 to 1000 times the period of the lowest frequency AC signal. It will be understood that a small RC constant will allow the capacitor C7 or C8 to rapidly overcharge and lead to high voltage being applied to the gates of the MOSFET's Q1, Q2 which could damage the MOSFET's.

During DC operation, i.e. for reading the DC temperature signal from the transducer 4, the maximum DC voltage applied to the gate terminals of the MOSFET's Q1 and Q2 needs to be carefully controlled. For the selected MOSFET devices, the voltage between the gate and source terminals should not exceed ±20 VDC. For example, if a +5 VDC voltage is applied on control line 122 or 124 to turn on the respective MOSFET pair Q1a and Q2a or Q1b and Q2b, then the voltage across the source and drain terminals cannot be brought lower than −15 VDC, otherwise the gate could be damaged. If a voltage greater than +1 VDC (i.e. +5 VDC minus the threshold gate voltage for the MOSFET, typically 4 VDC), then both MOSFET transistors Q1 and Q2 would turn off and the switching element 420 would be inoperable. Accordingly for DC operation, the control voltage for activating the MOSFET's Q1 and Q2 is in the range 0 to −12 VDC.

As shown in FIG. 6, the electronic relay 400 includes capacitors $C_s$ for filtering noise from the respective transducers 4 which could be coupled to the controller 3 through the stray capacitance between the source and drain of the MOSFETs Q1a, Q2a or Q1b, Q2b as described above for FIG. 3.

The present invention may be embodied in other specific forms without departing from the spirit or essential characteristics thereof. While the subject invention has been described with reference to an ultrasonic measurement device, certain adaptations and modifications of the invention will be obvious to those skilled in the art, for other applications in which conventional electromechanical relays have been utilized. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. An electronic relay for selectively coupling a transducer to an electronic circuit, the transducer including an input/output port for receiving excitation signals from the electronic control circuit and transmitting echo signals to the electronic control circuit, said electronic relay comprising:
   (a) a solid state switch having a first port connected to the input/output port of the transducer, a second port coupled to the electronic control circuit, and means for actuating said switch to electrically connect the input/output port of the transducer to the electronic control circuit in an on-state and isolate the input/output port from the electronic control circuit in an off-state, said means for actuating being responsive to a control signal from the electronic control circuit;
   (b) leakage current control means coupled to said solid state switch for controlling leakage current when said solid state switch is open so that the transducer is electrically isolated from the electronic control circuit.

2. The electronic relay as claimed in claim 1, wherein said leakage current control means comprises a circuit coupled to said solid state switch and having means for generating a null voltage drop across said solid state switch when said switch is open.

3. The electronic relay as claimed in claim 2, wherein said solid state switch comprises first and second MOSFET transistors each having respective source, drain and gate terminals, the source terminals being connected together and the gate terminals being connected together, and the drain of said first transistor forming said second port for coupling to the electronic control circuit, and the drain of said second transistor forming said first port for coupling to the input/output port of the transducer, and said gate terminals providing an input for said control signal.

4. The electronic relay as claimed in claim 3, wherein said means for actuating includes means for generating an isolated voltage signal in response to said control signal, said isolated voltage signal being applied across the gate and source terminals of said first and second MOSFET transistors.

5. The electronic relay as claimed in claim 4, wherein said means for generating an isolated voltage signal comprises a capacitor having one terminal connected to said source terminals and a second terminal connected to said gate terminals, and a resistor having one terminal connected to said gate terminals and another terminal forming an input for said control signal.

6. The electronic relay as claimed in claim 4, wherein said means for generating an isolated voltage signal comprises a photo-voltaic device having first and second output terminals, a control terminal, and photo-voltaic means for generating an output signal on said output terminals in response to an input signal on said control terminal, said first output terminal being connected to said source terminals and said second output terminal being connected to said gate terminals, and said control terminal forming an input for said control signal.

7. The electronic relay as claimed in claim 2, wherein said leakage current control means comprises a unity gain amplifier stage and a switching element, said amplifier having an input and an output, and said switching element having a switch input, a switch output and a switching control means for switching said switch input to said switch output, said amplifier input being coupled to the second port of said solid state switch, said amplifier output being coupled to said switch input and said switch output being coupled between the input/output port of the transducer and the first port of said solid state switch, and said switching control means being responsive to said control signal in an inverted state for coupling said amplifier output to the first port of said solid state switch so that the voltage drop across said solid state switch is null.

8. The electronic relay as claimed in claim 7, wherein said solid state switch comprises first and second MOSFET transistors each having respective source, drain and gate terminals, the source terminals being connected together and the gate terminals being connected together, and the drain of said first transistor forming said second port for coupling to the electronic control circuit, and the drain of said second transistor forming said first port for coupling to the input/output port of the transducer, and said gate terminals providing an input for said control signal, and the output from said switching element being coupled to the source terminals of said first and second transistors and the input from said unity gain amplifier being coupled to the drain of said first transistor.

9. The electronic relay as claimed in claim 8, wherein said switch element comprises third and fourth MOSFET transistors each having respective source, drain and gate terminals, the source terminals being connected together and the gate terminals being connected together, and the drain of said third transistor forming said switch output, and the drain of said fourth transistor forming said switch input for coupling to said amplifier output, and said gate terminals providing an input for said inverted control signal, and said switch output being coupled to the source terminals of said first and second transistors and said amplifier input being coupled to the drain of said first transistor.

10. The electronic relay as claimed in claim 9, wherein said switching control means comprises a photo-voltaic device having first and second output terminals, a control terminal, and photo-voltaic means for generating an output signal on said output terminals in response to said inverted control signal, said first output terminal being connected to said source terminals and said second output terminal being connected to said gate terminals, and said control terminal forming an input for said control signal.

11. The electronic relay as claimed in claim 5, wherein said leakage current control means comprises first and second bi-polar transistors and an amplifier stage, each of said bi-polar transistors having respective emitter, base, and collector terminals, and said amplifier stage having an input and an output, the collector of said first bi-polar transistor being coupled to the source terminals of said first and second MOSFET transistors and the base of said first bi-polar transistor being connected to the collector of said second bi-polar transistor and coupled to the output of said amplifier stage, the base of said second bi-polar transistor being coupled to the input terminal of said resistor, said emitter terminals of said first and second bi-polar transistors being connected, and the input of said amplifier stage being connected to the drain of said first MOSFET transistor, said second bi-polar transistor including means responsive to said control signal for disabling said first bi-polar transistor when said solid state switch is in the on-state, and said first bi-polar transistor including means responsive to the amplifier output when said solid state switch is in the off-state for turning on said first bi-polar transistor and when turned on said first bi-polar transistor coupling the voltage level at the drain of the second MOSFET transistor to the source of said first MOSFET transistor so that the voltage drop across said first MOSFET transistor is null.

12. An electronic relay for selectively coupling a transducer to an electronic circuit, the transducer including an input/output port for receiving excitation signals from the electronic control circuit and transmitting echo signals to the electronic control circuit, said electronic relay comprising:

(a) a solid state switch having a first port connected to the input/output port of the transducer, a second port coupled to the electronic control circuit, and means for actuating said switch to electrically connect the input/output port of the transducer to the electronic control circuit in an on-state and isolate the input/output port from the electronic control circuit in an off-state, said means for actuating being responsive to a control signal from the electronic control circuit;

(b) said means for actuation comprising a resistor and capacitor network coupled to said switch and having an input port for receiving said control signal.

13. The electronic relay as claimed in claim 12, wherein said solid state switch comprises first and second MOSFET transistors each having respective source, drain and gate terminals, the source terminals being connected together and the gate terminals being connected together, and the drain of said first transistor forming said second port for coupling to the electronic control circuit, and the drain of said second transistor forming said first port for coupling to the input/output port of the transducer, and said gate terminals being connected to one terminal of the capacitor in said network and said source terminals being connected to the other terminal of the capacitor and to one terminal of said resistor, and the other terminal of said resistor providing an input for said control signal.

14. The electronic relay as claimed in claim 13, wherein said resistor and said capacitor have a RC time constant at least 100 times the period of the lowest frequency AC signal switched by said relay.

* * * * *